United States Patent
McGuire (10) Patent No.: US 9,040,181 B2
(45) Date of Patent: May 26, 2015

(54) MODULAR INTRINSICALLY-SAFE FIELD DEVICE POWER MODULE

(75) Inventor: Chad M. McGuire, Shakopee, MN (US)

(73) Assignee: Rosemount Inc., Eden Prairie, MN (US)

( * ) Notice: Subject to any disclaimer, the term of this patent is extended or adjusted under 35 U.S.C. 154(b) by 658 days.

(21) Appl. No.: 12/900,659

(22) Filed: Oct. 8, 2010

(65) Prior Publication Data

US 2011/0171497 A1    Jul. 14, 2011

Related U.S. Application Data

(60) Provisional application No. 61/294,541, filed on Jan. 13, 2010.

(51) Int. Cl.
| | |
|---|---|
| H01M 2/10 | (2006.01) |
| H01M 2/04 | (2006.01) |
| H01R 33/95 | (2006.01) |
| H01R 33/945 | (2006.01) |
| H05K 7/14 | (2006.01) |
| H02B 1/00 | (2006.01) |
| H02B 1/06 | (2006.01) |

(52) U.S. Cl.
CPC ............... *H01M 2/0443* (2013.01); *H02B 1/00* (2013.01); *H02B 1/06* (2013.01); *H01R 33/95* (2013.01); *H01R 33/945* (2013.01); *H01M 2/10* (2013.01); *H01M 2/1016* (2013.01); *H01M 2200/00* (2013.01); *H01M 2200/103* (2013.01); *H05K 7/1462* (2013.01)

(58) Field of Classification Search
CPC .... H01M 2/10; H01M 2/1011; H01R 33/945; H01R 33/95; H02B 1/00; H02B 1/06
USPC ................................................ 429/7; 361/600
See application file for complete search history.

(56) References Cited

U.S. PATENT DOCUMENTS

| | | | |
|---|---|---|---|
| 6,680,690 B1 | 1/2004 | Nilsson et al. | 342/124 |
| 6,925,419 B2 | 8/2005 | Duren et al. | 702/184 |
| 2003/0171827 A1 | 9/2003 | Keyes et al. | 700/19 |
| 2005/0245291 A1 | 11/2005 | Brown et al. | 455/572 |

(Continued)

FOREIGN PATENT DOCUMENTS

| | | |
|---|---|---|
| CN | 1785699 A | 6/2006 |
| JP | 2009527889 A | 7/2009 |
| WO | WO 2007/098222 | 8/2007 |

OTHER PUBLICATIONS

Office Action for the corresponding Chinese patent application No. 201080013411.4 dated Aug. 22, 2012. 18 pages.

(Continued)

*Primary Examiner* — Jonathan G Leong
*Assistant Examiner* — James Erwin
(74) *Attorney, Agent, or Firm* — Westman, Champlin & Koehler, P.A.

(57) ABSTRACT

A modular, intrinsically-safe power module assembly is provided. The assembly includes a rigid conduit adapter configured to mount to a conduit of a field device. A housing, having an interior, is operably coupled to the rigid conduit adapter and is physically supported by the rigid conduit adapter. At least one non-rechargeable battery is disposed within the housing. Intrinsic safety circuitry is coupled to the at least one non-rechargeable battery, and is coupled to a connector that mates with a cooperative connector in the rigid conduit adapter.

15 Claims, 6 Drawing Sheets

(56) References Cited

U.S. PATENT DOCUMENTS

| | | | |
|---|---|---|---|
| 2007/0201192 A1 | 8/2007 | McGuire et al. | 361/600 |
| 2007/0285224 A1 | 12/2007 | Karschnia et al. | 340/538 |
| 2008/0274772 A1 | 11/2008 | Nelson et al. | 455/572 |
| 2008/0280568 A1 | 11/2008 | Kielb et al. | 455/74.1 |
| 2008/0310195 A1 | 12/2008 | Seberger et al. | 363/26 |
| 2009/0015216 A1 | 1/2009 | Seberger et al. | 323/234 |
| 2010/0123591 A1* | 5/2010 | Bauschke et al. | 340/656 |

OTHER PUBLICATIONS

Notification of Transmittal of the International Search Report and the Written Opinion from the International patent application No. PCT/US2010/054229 dated Feb. 16, 2011.

Office Action for the corresponding Chinese patent application No. 201080013411.4 dated Apr. 1, 2013.

Office Action dated Oct. 23, 2013 in related Russian patent appln. No. 2012134461. 7 pgs including English Translation.

Canadian Office Action for Canadian Patent Application No. 2,786,582, dated May 31, 2013, 2 pages.

First Office Action (Notification of Reasons for Rejection) dated Jan. 7, 2014 in related Japanese patent application 2012-544501, 7 pgs. including English Translation.

Russian Office Action dated Feb. 6, 2014 in related Russian application Serial No. 2012134461/07(055054), filed Oct. 27, 2010. 5 pgs including English Translation.

Russian Office Action dated Aug. 8, 2014 for corresponding Russian Application No. 2012134461, filed Oct. 27, 2010.

Communication pursuant to Article 94(3) EPC for European Patent Application No. 10 784 890.5-1360, dated Jun. 16, 2014, 5 pages.

Japanese Office Action from JP 2012-544501, dated Nov. 11, 2014.

\* cited by examiner

MODULAR INTRINSICALLY-SAFE FIELD DEVICE POWER MODULE

CROSS-REFERENCE TO RELATED APPLICATION

The present application is based on and claims the benefit of U.S. provisional patent application Ser. No. 61/294,541, filed Jan. 13, 2010, the content of which is hereby incorporated by reference in its entirety.

BACKGROUND

In industrial settings, control systems are used to monitor and control inventories of industrial and chemical processes, and the like. Typically, the control system performs these functions using a number of field devices distributed at key locations in the industrial process. Field devices may operate in a variety of different installations. Examples of process installations include petroleum, pharmaceutical, chemical, pulp and other processing installations. These field devices are communicatively coupled to control circuitry in a control room.

Field devices are used by the process control measurement industry for a variety of purposes. Usually, such devices have a field-hardened enclosure so that they can be installed outdoors in relatively rugged environments and be able to withstand climatological extremes of temperature, humidity, vibration and mechanical shock. Field devices also typically operate on relatively low power. For example, some field devices are currently available that receive all of their operating power from a known 4-20 mA loop.

The environment within which the field devices operate can sometimes be highly volatile. Some environments may be so volatile that an errant spark or a sufficiently high surface temperature of an electrical component could cause the environment to ignite and generate an explosion. In order to ensure that such situations do not occur, intrinsic safety specifications have been developed. Compliance with an intrinsic safety requirement helps ensure that even under fault conditions, the circuitry or device itself cannot ignite a volatile environment. One specification for an intrinsic safety requirement is set forth in: APPROVAL STANDARD INTRINSICALLY SAFE APPARATUS AND ASSOCIATED APPARATUS FOR USE IN CLASS I, II AND III, DIVISION 1 HAZARDEOUS (CLASSIFIED) LOCATIONS, CLASS NUMBER 3610, promulgated by Factory Mutual Research October 1988. Adaptations to comply with additional industrial standards such as Canadian Standards Association (CSA) and the European CENELEC standards are also contemplated.

Traditionally, field devices have been coupled to the process communication system (such as a control room) by virtue of physical conductors. Such wired connections have not only provided power to the field devices, but have also provided a route for communication. One limitation with wired field devices is that installation can sometimes be labor intensive since wires must be run to each physical location of a field device.

More recently, field devices have emerged that employ wireless communication to communicate with the control room and/or other suitable devices. These wireless field devices are generally provided with an internal power source, such as a battery, that can provide operating power for the wireless field device for a period of years.

The use of wireless technology in the industrial process industry has created a need for a way to locally power wireless transmitters. Batteries are one way that local power can be provided. However, one problem with batteries lies in the decision about how and where to locate the batteries within the wireless field device. It is desirable for battery replacement to be easy for field technicians. It is not only desirable that the battery itself be physically easy to replace, but also desirable in cases where the field device is located in a hazardous area. Specifically, it is desirable to be able for the technician to replace the battery without the need for obtaining a hot work permit. This means that the battery can be replaced in an area where there is flammable gas present without risk of igniting that gas.

Another difficulty regarding the use of batteries in wireless field devices is due to the fact that the capacity of the batteries is generally related to the physical size of the battery itself. Thus, the size of batteries located inside a device is often constrained by the housing of the device itself. There is generally little flexibility in offering large-capacity battery packs to support longer transmitter life and/or higher update rates or heavy load due to network configuration.

Accordingly, there is a need for an intrinsically safe battery pack that can power field devices and be replaceable in the field without requiring hot work permits. Further, it is desirable that field device power be provided in such a way that larger-capacity batteries and/or higher power demands can be accommodated.

SUMMARY OF THE INVENTION

A modular, intrinsically-safe power module assembly is provided. The assembly includes a rigid conduit adapter configured to mount to a conduit of a field device. A housing, having an interior, is operably coupled to the rigid conduit adapter and is physically supported by the rigid conduit adapter. At least one non-rechargeable battery is disposed within the housing. Intrinsic safety circuitry is coupled to the at least one non-rechargeable battery, and is coupled to a connector that mates with a cooperative connector in the rigid conduit adapter.

DETAILED DESCRIPTION OF ILLUSTRATIVE EMBODIMENTS

Figure 1:
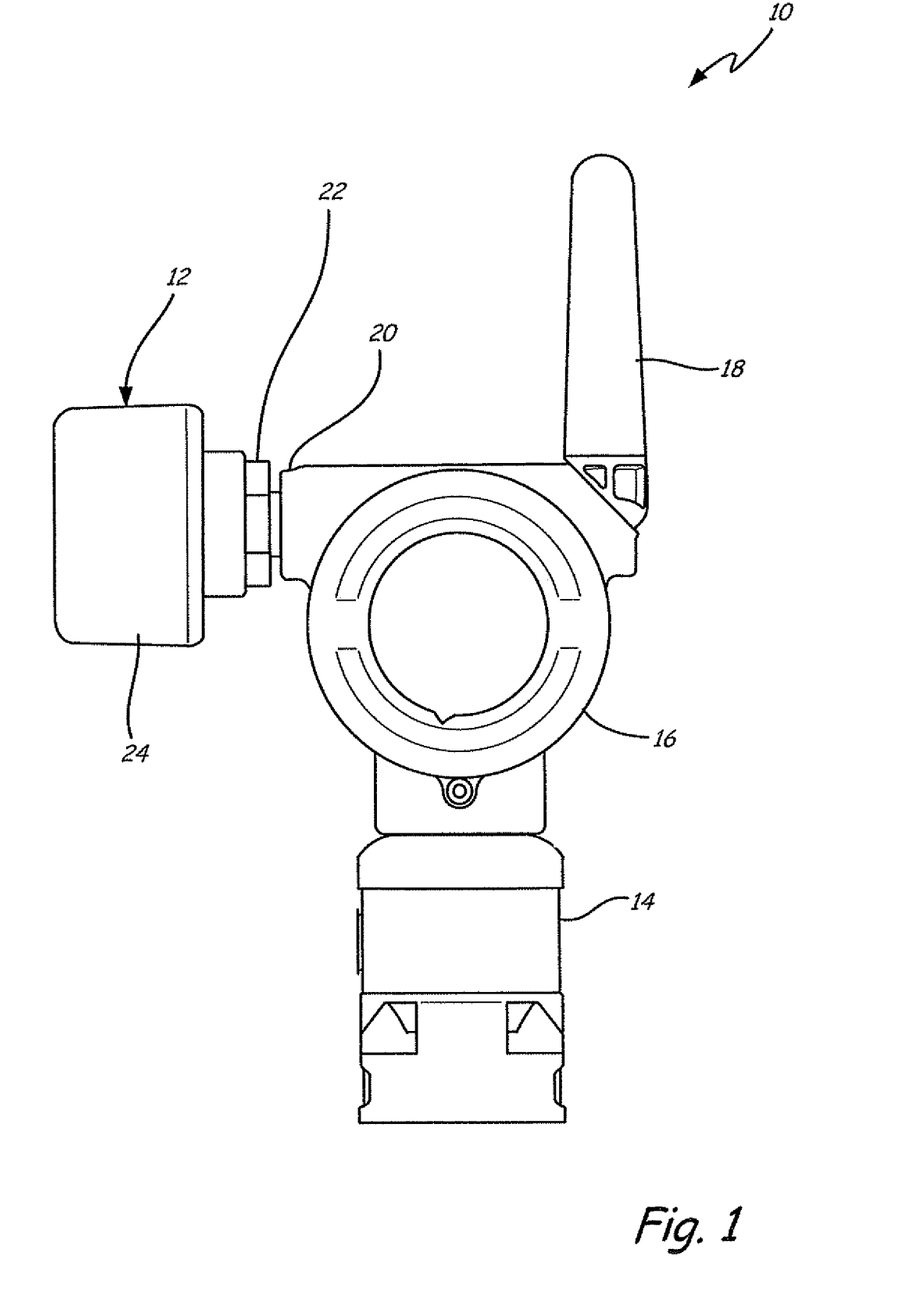
FIG. 1 is a front elevation view of a wireless field device employing a battery pack in accordance with an embodiment of the present invention.

FIG. 1 is a front elevation view of wireless field device 10 coupled to external battery pack 12 in accordance with an embodiment of the present invention. Field device 10 generally includes a sensor module 14 that is mountable proximate a process installation site. One or more sensors disposed within or coupled to sensor module 14 provide electrical indications relative to the process. Examples of sensors include absolute, gage, and/or differential pressure sensors as well as temperature sensors and other suitable devices. Sensor module 14 is coupled to electronics compartment 16 which contains electronics to process or otherwise transform the electrical signals received from the one or more sensors into usable information that can be conveyed to other devices. Electronics compartment 16 generally contains communication circuitry, such as wireless communication circuitry that communicates via antenna 18 with other devices. Communication circuitry within compartment 16, using antenna 18, can communicate with a gateway device, or other field devices disposed between field device 10 and the gateway device to interact with the gateway device. Wireless field devices are generally known, one example of a commercially-available wireless field device is under the trade designation model 3051S wireless, available from Emerson Process Management of Chanhassen, Minn. Field device 10 may be one of a number of field devices disposed in a process installation in what may be termed "mesh" network.

Generally, wireless field devices, such as wireless field device 10, employ an internal battery pack that lasts for a period of years. However, when the energy of the battery pack is depleted, a technician must generally travel to the physical location of field device 10, and replace the battery pack. In situations where the physical environment proximate the field device is volatile, or even explosive, it was generally necessary for the technician to obtain a hot work permit in order to replace the battery within the field device. Obtaining such a permit is time consuming, and requires additional effort in order to ensure that the work can be done safely in the volatile environment.

In accordance with an embodiment of the present invention, the batteries used to power field device 10 are located in a module (module 12) that is external to electronics compartment 16. As illustrated in FIG. 1, the module itself, in accordance with one embodiment, is physically supported by its mount to conduit entry 20 on electronics compartment 16. This mount is generally accomplished by virtue of a rigid, and preferably metal, conduit adapter 22 that is threaded into, or otherwise secured, within conduit 20. Rigid conduit adapter 22 provides a robust physical mount for module 12 since the entire field device/battery module system may be subject to vibration or other mechanical shocks. Battery module 12 also includes a battery enclosure 24 sealingly enclosing and protecting batteries as well as other suitable circuitry within battery module 12. Finally, battery module 12 is designed in such a way that the electrical energy available at the interface between battery module 12 and adapter 22 comply with intrinsic safety requirements. This helps to ensure that even if the pins or connector contacts themselves are shorted, that a spark will not be generated that could potentially ignite the hazardous environment. Physically, battery module 12 preferably employs a locking mechanism that not only securely mounts the module to rigid conduit adapter 22, but also easily allows the technician to remove the battery module when replacement is desired.

Figure 2:
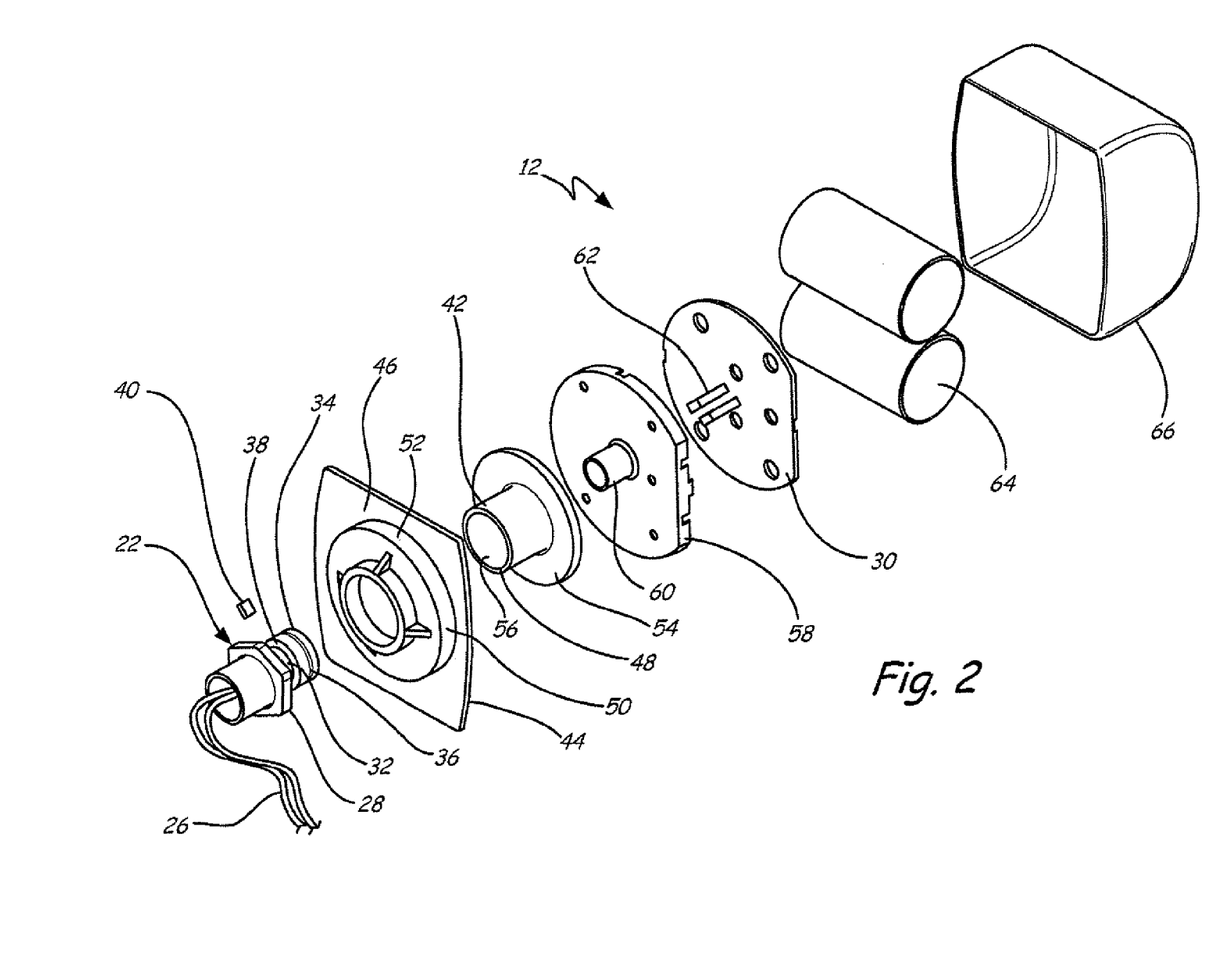
FIG. 2 is an exploded diagram of a battery pack for a field device in accordance with an embodiment of the present invention.

FIG. 2 is an exploded perspective view of battery module 12 in accordance with an embodiment of the present invention. As illustrated in FIG. 2, rigid conduit adapter 22 includes a plurality of electrical conductors 26 which couple to a terminal board of field device 10 (shown in FIG. 1). Rigid conduit adapter 22 generally includes hexagonal surface 28 that is provided to facilitate installing conduit adapter 22 into conduit 20 using a suitable wrench. Rigid conduit adapter 22 also includes a plurality of electrical connectors (such as multi-spring fingers or pins that engage cooperative elements disposed on circuit card 30). Further, rigid conduit adapter 22 is also preferably cylindrical and includes necked-down portion 32 and seal portion 34 which preferably includes O-ring 36 to generate an environmental seal between rigid conduit adapter 22 and battery pack 12. O-ring 36 can be formed of any suitable material. Shoulder 38 joins necked-down portion 32 and seal portion 34. Shoulder 38 provides additional mechanical integrity to the assembly in that once set screw 40 is engaged through set screw hole 42, assembly 12 is fully engaged upon rigid conduit adapter 22. Shoulder 38 provides additional support to ensure that assembly 12 cannot be pulled from rigid conduit adapter 22 since such motion would cause interference between set screw 40 and shoulder 38. Although the embodiment illustrated with respect to FIG. 2 utilizes set screw 40, any suitable mechanical device can be used to essentially lock or otherwise affix battery module 12 to rigid conduit adapter 22 in such a way that technicians can easily remove the module when replacement is desired.

According to one embodiment, battery module 12 includes a housing formed by plate 44, which is generally planar, cooperating with enclosure 66. Housing 43 has an interior that may, in some embodiments, have more volume than the interior of electronics compartment 16 of field device 10. Plate 44 includes an aperture 46 sized to pass metal flange 48. Additionally, plate 44 also includes an annular ring 50 comprised of a relatively thicker portion of material and a number of ribs 52. Annular ring 50 and ribs 52 provide mechanical integrity to couple to surface 54 of metal flange 48. Thus, much of the strength of metal flange 48 is imparted to plate 44. Metal flange 48 can be constructed from any suitable metallic material that offers sufficient strength. Examples include stainless steel, aluminum, et cetera. Flange 48 includes an internal bore 56 that sized to pass over sealing portion 34 of rigid conduit adapter 22. Bore 56 has an internal diameter that is sized slightly larger than sealing portion 34 in order to provide structural support as well as to help seal the connection between battery module 12 and rigid conduit adapter 22.

Plastic shroud 58 is coupled to metal flange 48 and includes electrical connector 60 that passes through bore 56. Shroud 58 provides support for electrical interconnect sockets 62 on circuit card 30 which sockets mate with pins disposed within rigid conduit adapter 22 in order to electrically couple battery module 12 to wireless field device 10. Preferably, connector 60, which houses the sockets 62, includes a keying feature to ensure that the connection between connector 60 and the mating device within rigid conduit adapter 22 can only occur in a single rotational orientation. This ensures that the connection can only be made with the correct polarity, and also helps protect the electrical interconnects (pins and sockets in one embodiment) while the module 12 is coupled to rigid conduit adapter 22.

Circuit card 30 can be constructed from any suitable circuit board material and supports a pair of electrical interconnects (preferably multi-spring finger socket connectors (such as those commercially-available from Mill-Max, Manufacturing Corporation of Oyster Bay, N.Y.)). Additionally, circuit card 30 includes electrical circuitry to ensure that module 12 complies with an intrinsic safety specification such as that set forth above. Circuitry (which will be described in greater detail with respect to FIG. 7) provides the features of a fuse (required for intrinsic safety for some batteries), current limiting circuitry that protects the fuse, and a low voltage cut off circuit that guards against one cell back-charging against the other when it becomes depleted. Battery module 12 also includes one or more non-rechargeable batteries 64 which are electrically coupled to circuitry disposed on circuit card 30. Any suitable battery chemistry can be used including both wet and dry cells. However, since the capacity of the batteries is generally related to the weight of the batteries, battery chemistries that offer higher energy densities may be advantageous for embodiments of the present invention in that such batteries will respond to system vibration and mechanical shocks with less inertia.

Finally, module 12 also includes an enclosure 66 that encloses all of metallic flange 48, plastic shroud 58, circuit card 30, and battery 64. Enclosure 66 mounts or otherwise is affixed to plate 44 to seal the components therein. Module 12, in accordance with one embodiment, may include a mechanical method, such as screws or a threaded cover between enclosure 66 and plate 44 to allow for one or more batteries 64 to be replaced in module 12. Further, such easy disassembly would also facilitate repair or replacement of other components within module 12. However, in accordance with another embodiment of the present invention, the entire void space within module 12 may be filled with a potting material thereby rendering the module as a one-time use module such that when battery 64 is depleted the entire module is simply replaced. Additionally, enclosure 66 and plate 44 can be made of conductive plastic to dissipate static charge buildup thus eliminating a potential shock hazard.

Module 12, in accordance with one embodiment, is mountable directly upon a conduit, such as conduit 20, of a field device. As such, any vibration or mechanical perturbations that are experienced by field device 10 will generally be transferred to battery module 12. These vibrations and/or movements can create stresses at the physical interconnection between field device 10 and battery module 12. It is a significant design challenge for the battery module 12 to be able to survive vibration requirements that field devices, such as field device 10, experience. The typical specification for a field-mounted device is IEC60770 high pipe-line vibration. This is a 3G level vibration input. Module 12 must not be damaged during this test and the electrical interconnection must be not moved with respect to the pin relative to the socket. If the pin moves relative to the socket, wear will occur and the interconnection reliability will be compromised. A prototype of the embodiment illustrated with respect to FIGS. 1 and 2 has passed the IEC 3G high pipe-line vibration test with no visible wear to interconnect pins or sockets.

Figure 3:
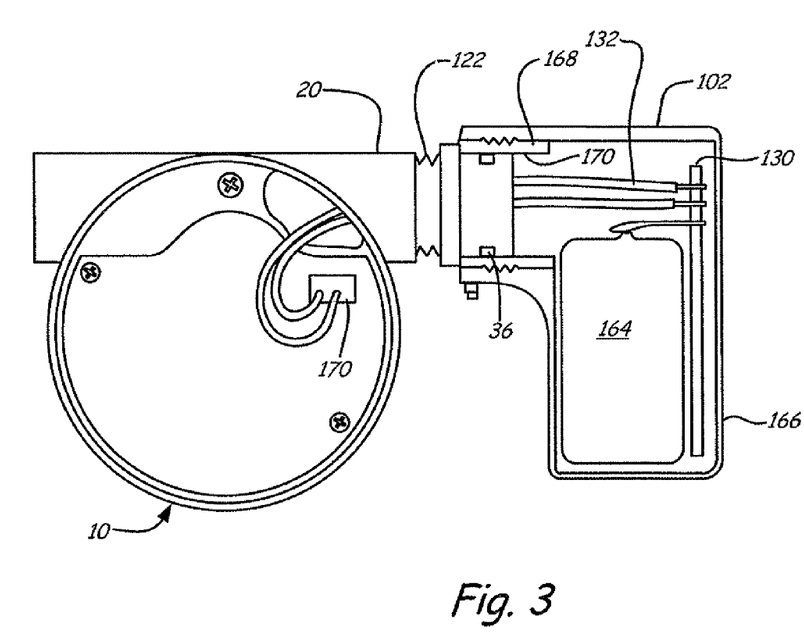
FIG. 3 is a cross sectional view of a field device coupled to a battery pack in accordance with an embodiment of the present invention.

FIG. 3 is a top cross sectional top view of a battery module 112 mounted to a conduit 20 of a wireless field device 10 in accordance with another embodiment of the present invention. In FIG. 3, one or more batteries 164 is electrically coupled to a circuit card 130 which is also coupled, via conductors 132, to rigid conduit adapter 122. Module 112 differs somewhat from module 12 (shown in FIG. 2) in that enclosure 166 is threaded to internal flange 168 which has an internal diameter 170 that receives rigid conduit adapter 22. As shown in FIG. 3, an elastemeric O-ring 36 is also employed. In some embodiments, conductors 132 can actually pass directly through the physical coupling between rigid conduit adapter 122 and module 112 and terminate in a connector 170 that couples directly to the field device terminal board.

Figure 4:
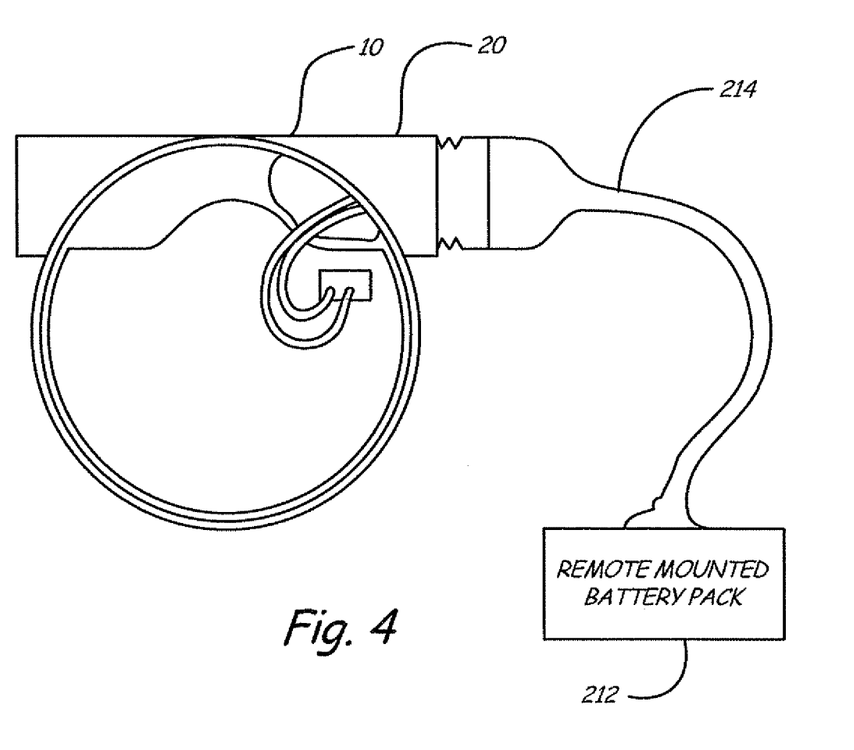
FIG. 4 is a cross sectional view of a field device coupled to a battery pack in accordance with another embodiment of the present invention.

In accordance with another embodiment of the present invention, the battery module may be mounted at a location that is spaced from the field device and coupled to the field device via a cable assembly. FIG. 4 is diagrammatic view of a remote-mounted battery module 212 coupled to a wireless field device 10 by virtue of cable assembly 214. Remote-mounted battery module 212 can be mounted to a post or wall, et cetera, and connected via cable assembly 214 to conduit entry 20 of field device 10. This embodiment allows the field device to be located in a high-temperature area and the battery module 212 to be located elsewhere in a cooler space to preserve battery life, since heat significantly diminishes battery life. This embodiment is also useful in powering wireless access points. Such wireless access points will be field mounted devices that bring wireless data from the field mesh network devices into a device gateway. These devices will typically require more power than standard field devices and may benefit from a larger battery option. Another benefit of the remote-mounted battery pack embodiment shown in FIG. 4 is that battery replacement is easier for field devices that are mounted in difficult to reach locations. The circuitry and components within remote battery module 212 may be similar or identical to those described with respect to FIG. 2, and the circuit diagram described below with respect to FIG. 7.

Figure 5:
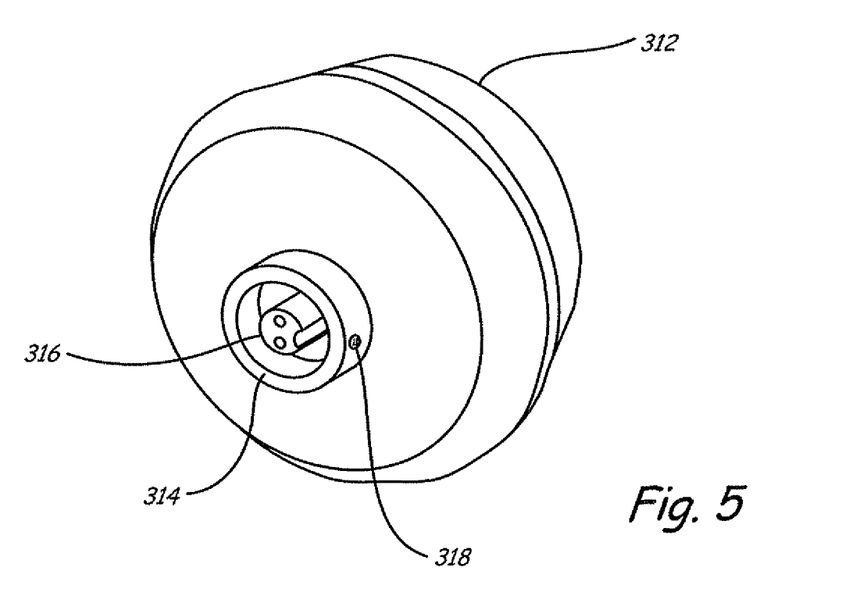
FIG. 5 is a perspective view of a battery pack for use with field devices in accordance with an embodiment of the present invention.

FIG. 5 is a perspective view of a field-device mountable battery module 312 in accordance with another embodiment of the present invention. Battery module 312 is generally circular in shape, and includes a metallic flange 314 and connector 316 that mate with suitable structures on rigid conduit adapter 22. Module 312 also includes a set screw disposed within a set screw bore for physically engaging necked down region 32 on rigid conduit adapter 22.

Figure 6:
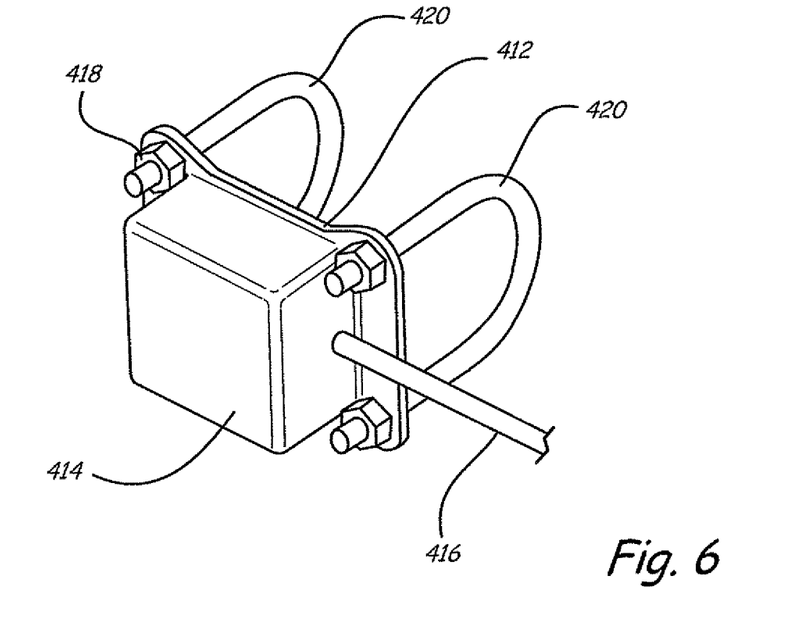
FIG. 6 is a perspective view of a remote-mount battery pack for use with field devices in accordance with an embodiment of the present invention.

FIG. 6 is a perspective view of a remote-mounted battery module 412 in accordance with another embodiment of the present invention. Remote module 412 includes generally rectangular area 414 within which the battery(s) and associated circuitry reside. Additionally, cable assembly 416 couples module 412 to a suitable device. As illustrated in FIG. 6, module 412 includes a flange 418 that has a number of apertures to receive u-bolts 420 to mount the module to a pipe or other suitable structure. Additionally, remote module 412 could also have a removable cover so that batteries could be replaced inside the remote module.

Figure 7:
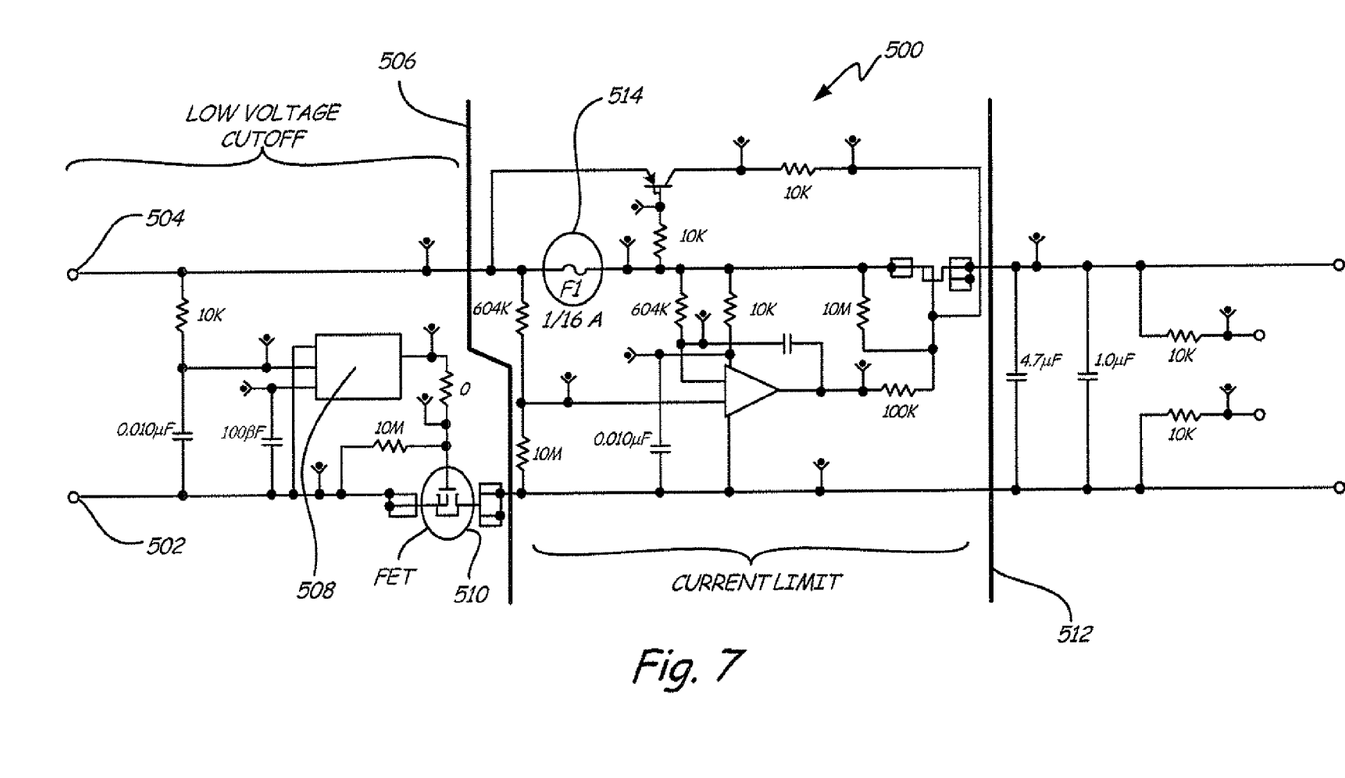
FIG. 7 is a circuit diagram of a circuit for coupling a battery or batteries to a field device terminal block in accordance with an embodiment of the present invention.

FIG. 7 is a circuit diagram of circuitry that may reside on circuit card 30 in accordance with embodiment of the present invention. Circuit 500 couples to one or more batteries at terminations 502, 504. Preferably, the spacing between components of circuit 500 on circuit card 30 comply with intrinsic safety facing requirements. As illustrated in FIG. 7, circuit 500 includes two primary portions. The portion from terminations 502, 504 through line 506 essentially provides a low-voltage cut off function. The output from supervisory circuit 508 drives field effect transistor 510 open at approximately four volts. (Note, two-cell battery packs initially provide approximately 7.2 volts). Thus, when the voltage of the pack reaches a specific threshold, the battery pack is completely electrically decoupled from the field device. The portion of circuit 500 between line 506 and line 512 provides a current limiting function that helps protect the current passing through fuse 514. Current limiting circuitry protects fuse 514 from blowing at currents above the fuse limit but below the safe limit for intrinsic safety. This is particularly useful in embodiments where the battery module is a one-time use, since a blown fuse would require the entire battery module to be replaced.

Although the present invention has been described with reference to preferred embodiments, workers skilled in the art will recognize that changes may be made in form and detail without departing from the spirit and scope of the invention.

What is claimed is:

1. A wireless field device for use in an industrial process, comprising:

a field device housing configured to contain a process variable sensor and mount proximate a process installation and including an electronics compartment having a conduit entry formed therein;

a rigid conduit adapter having a first end configured to mount to the conduit entry of the field device;

a module housing operably coupled to a second end of the rigid conduit adapter and physically supported by the rigid conduit adapter, the module housing having an interior;

at least one non-rechargeable battery disposed within the module housing; and intrinsic safety circuitry coupled to the at least one non-rechargeable battery, the intrinsic safety circuitry being coupled to a connector that mates within the rigid conduit adapter with a cooperative connector disposed in the rigid conduit adapter and thereby power the wireless field device with power from the at least one non-rechargeable battery.

2. The wireless field device of claim 1, wherein the module housing is comprised of a plate and enclosure joined together.

3. The wireless field device of claim 2, wherein the plate and enclosure are removably joined together.

4. The wireless field device of claim 2, wherein the interior of the module housing is filled with a potting compound.

5. The wireless field device of claim 2, wherein the module housing further comprises a metal flange sized to pass over an outer surface of the rigid conduit adapter.

6. The wireless field device of claim 5, and further comprising a locking member configured to lock the metal flange to the rigid conduit adapter.

7. The wireless field device of claim 6, wherein the locking member is a set screw.

8. The wireless field device of claim 6, wherein the plate includes an annular ring sized to mount to the metal flange.

9. The wireless field device of claim 1, wherein the intrinsic safety circuitry includes a fuse.

10. The wireless field device of claim 9, wherein the intrinsic safety circuitry includes current-limiting circuitry to limit current through the fuse.

11. The wireless field device of claim 1, wherein a volume of the interior of the module housing is larger than an interior of the electronics compartment of the field device.

12. The modular, intrinsically-safe power module assembly of claim 11, wherein the at least one-non-rechargeable battery includes a plurality of non-rechargeable batteries disposed within the module housing.

13. The wireless field device of claim 12, wherein the plurality of batteries are replaceable.

14. The wireless field device of claim 1, wherein the rigid conduit adapter is formed of a metal.

15. The wireless field device of claim 1, wherein:

the at least one non-rechargeable battery is electrically coupled to an electrical circuit within the module housing; and the rigid conduit adapter includes electrical connectors that electrically couples to the electrical circuit in the module housing to circuitry in the electronics compartment.

* * * * *